United States Patent
Zhang et al.

(10) Patent No.: US 11,942,916 B2
(45) Date of Patent: Mar. 26, 2024

(54) FABRICATING METHOD OF FILM BULK ACOUSTIC RESONATOR

(71) Applicant: SUZHOU INSTITUTE OF NANO-TECH AND NANO-BIONICS (SINANO), CHINESE ACADEMY OF SCIENCES, Suzhou (CN)

(72) Inventors: Xiaodong Zhang, Suzhou (CN); Wenkui Lin, Suzhou (CN); Baoshun Zhang, Suzhou (CN)

(73) Assignee: SUZHOU INSTITUTE OF NANO-TECH AND NANO-BIONICS (SINANO), CHINESE ACADEMY OF SCIENCES, Suzhou (CN)

(*) Notice: Subject to any disclaimer, the term of this patent is extended or adjusted under 35 U.S.C. 154(b) by 751 days.

(21) Appl. No.: 17/053,798

(22) PCT Filed: Oct. 19, 2018

(86) PCT No.: PCT/CN2018/111052
§ 371 (c)(1),
(2) Date: Nov. 9, 2020

(87) PCT Pub. No.: WO2020/062364
PCT Pub. Date: Apr. 2, 2020

(65) Prior Publication Data
US 2021/0265967 A1    Aug. 26, 2021

(30) Foreign Application Priority Data
Sep. 26, 2018    (CN) .......................... 201811127172.X

(51) Int. Cl.
*H03H 3/02*    (2006.01)
*H03H 9/02*    (2006.01)
*H03H 9/17*    (2006.01)

(52) U.S. Cl.
CPC .......... *H03H 3/02* (2013.01); *H03H 9/02031* (2013.01); *H03H 9/174* (2013.01);
(Continued)

(58) Field of Classification Search
CPC .... H03H 3/02; H03H 2003/021; H03H 9/173; H03H 2003/023; H03H 9/25; H03H 9/13;
(Continued)

(56) References Cited

U.S. PATENT DOCUMENTS 6,349,454 B1 * 2/2002 Manfra ................ H03H 9/174
29/25.35
6,816,038 B2 * 11/2004 Umemoto ............ H03H 2/001
333/219.2

(Continued)

FOREIGN PATENT DOCUMENTS

CN    107222181 A    9/2017
JP    2005109678 A    4/2005

*Primary Examiner* — Thiem D Phan
(74) *Attorney, Agent, or Firm* — Bayramoglu Law Offices LLC

(57) ABSTRACT

A film bulk acoustic resonator and a fabricating method thereof is provided. The fabricating method includes: fabricating a lower electrode on a first surface of an SOI substrate; forming piezoelectric layers on the first surface of the SOI substrate and the lower electrode; forming top electrodes on the piezoelectric layers; processing an air cavity on a second surface of the SOI substrate, wherein the second surface and the first surface are oppositely arranged. The fabricating method simplifies a preparation process of FBAR, a quality of a AlN film crystal grown though the fabrication method is high, an improvement of a device performance is facilitated, and meanwhile a thickness of a top silicon is controlled through a position of a silicon injected oxygen isolation to regulate a frequency of the film bulk acoustic resonator.

20 Claims, 4 Drawing Sheets

(52) U.S. Cl.
CPC ....... *H03H 9/176* (2013.01); *H03H 2003/023* (2013.01); *Y10T 29/42* (2015.01)

(58) Field of Classification Search
CPC ............ H03H 9/02047; H03H 9/02007; Y10T 29/42; Y10T 29/49005; Y10T 29/49126
USPC .................................... 29/25.35, 592.1, 594
See application file for complete search history.

(56) References Cited

U.S. PATENT DOCUMENTS

| | | |
|---|---|---|
| 7,323,953 B2 | 1/2008 | Yokoyama et al. |
| 2002/0067106 A1 | 6/2002 | Sunwoo et al. |
| 2004/0027216 A1 | 2/2004 | Ma et al. |
| 2004/0135144 A1 | 7/2004 | Yamada et al. |
| 2010/0060384 A1 | 3/2010 | Taniguchi et al. |

\* cited by examiner

FABRICATING METHOD OF FILM BULK ACOUSTIC RESONATOR

CROSS REFERENCE TO THE RELATED APPLICATIONS

This application is the national stage entry of International Application No. PCT/CN2018/111052, filed on Oct. 19, 2018, which is based upon and claims priority to Chinese Patent Application No. 201811127172.X, filed on Sep. 26, 2018, the entire contents of which are incorporated herein by reference.

TECHNICAL FIELD

The present application particularly relates to a film bulk acoustic resonator and a fabricating method thereof, belonging to the technical field of communication electronic components.

BACKGROUND

In 2017, the shipments of domestic smart phones reached 461 million. The resonator is a core element of duplexers and filters widely applied to radio frequency front-ends of mobile terminal; and with the development of communication, the number of simultaneously compatible communication wave bands in mobile phones is increasing, and the number of required resonators is also gradually increasing. The development trend of multiple function and integration of a wireless communication system and the year-by-year increasing of the number of devices put forward requirements for resonators, such as miniaturization, integration, high frequency and high performance; since the traditional microwave resonator uses an electromagnetic wave as a carrier wave, the currently applied communication frequency band requires an extremely large resonator size; opposite to the existing requirement of miniaturization, the wave velocity of the acoustic wave is lower than that of the electromagnetic wave by 4-5 orders of magnitude, and the size of the corresponding acoustic resonator is 4-5 orders of magnitude smaller than the volume of electromagnetic wave resonator, which meets the requirements of the current devices. Meanwhile, compared with the present surface acoustic resonator device, in the case of high frequency, the bulk acoustic resonator is relatively low in process difficulty and easily realizes integration. However, since the surface acoustic resonator is in plane wave propagation, the energy is concentrated in the interdigital region, and the loss is too large. Therefore, the film bulk acoustic resonator more meets the development trend of the existing mobile phone RF front-end.

The principle of the film bulk acoustic resonator is to apply an electrical signal between upper and lower electrodes by utilizing the piezoelectric effect of the piezoelectric layer. Because the piezoelectric effect of the piezoelectric layer can generate an acoustic signal, the acoustic signal oscillates between the electrodes. Only the acoustic signal meeting the total reflection condition of the acoustic wave can be retained, and the rest acoustic signals are consumed. This acoustic signal is then converted into an electrical signal to be output, thereby realizing the frequency selection of electrical signals. At present, the materials used for the piezoelectric layer include ZnO, PZT and AlN. Because the AlN preparation process is relatively perfect, AlN has the characteristics of a proper electromechanical coupling coefficient and compatibility with a microelectronic technology, and is selected as an appropriate piezoelectric layer material.

The structure of the traditional film bulk acoustic resonator is as shown in FIG. 1, a support layer, a lower electrode, the piezoelectric layer and an upper electrode are formed on the Si substrate in turn, the acoustic wave is limited inside the device by the air cavity. Around November, 2017, the Ministry of industry and information technology of China officially delimited the 5G system middle-frequency band range, no longer accepted and approved newly applied other adjacent frequency bands. The advancement of 5G era has brought new challenges to resonators. The structures of FBAR produced by Japan Fujitsu company and its relevant products are relatively diverse. From the perspective of relevant patents applied by its company, the structure form of the FBAR can be roughly divided into two categories: air cavity type (such as U.S. Pat. No. 7,323,953B2) and air gap (e.g. patent US20100060384A1), in which the air gap needs to be filled with a sacrificial layer and then ground and polished, the process is complex and complicated. For the traditional film bulk acoustic resonators which use metal electrodes, loss is large. At the same time, because the piezoelectric film is deposited or sputtered on the patterned electrode, there is a stress at the step, which can cause the distortion of the film thicknesses of the piezoelectric layer and its electrode at this position, resulting in a stress concentration phenomenon to influence the structural reliability of the device. For the traditional device, the lower electrode produces steps after patterning, and there is a stress at the step, which causes the distortion of the film thicknesses of the piezoelectric layer and its electrode at this position, resulting in the stress concentration phenomenon to influence the structural reliability of the device.

SUMMARY

The main objective of the present application is to provide a film bulk acoustic resonator and a fabricating method thereof so as to overcome the defects in the prior art.

In order to realize the above objective of the disclosure, the technical solution adopted by the present application includes: Embodiments of the present application provide a fabricating method of a film bulk acoustic resonator, comprising:
fabricating a lower electrode on a first surface of an SOI substrate;
forming piezoelectric layers on the first surface of the SOI substrate and the lower electrode;
forming top electrodes on the piezoelectric layers; and
processing an air cavity on a second surface of the SOI substrate, wherein the second surface and the first surface are oppositely arranged.

Compared with the prior art, the present application has the advantages:
(1) the fabricating method of the film bulk acoustic resonator provided in the embodiments of the present application uses SOI as a substrate, which reduces the cost of device preparation. The fabricated resonator has the characteristics of low power consumption, high integrated density, low cost and good radiation resistance;
2) the fabricating method of the film bulk acoustic resonator provided by the embodiments of the present application is simple in process, does not need to grow and etch a stop layer and a support layer on the substrate, and the structures of the stop layer and the support layer are replaced by insulating layers in the SOI substrate;
3) according to the fabricating method of the film bulk acoustic resonator provided in the embodiments of the present application, highly doped silicon is formed by ion implantation in a selected region; and the highly doped silicon is used as the electrode, thereby eliminating the influence of step structure brought by the traditional electrode;
4) When the top Si of the SOI substrate is in (111) orientation, the crystal quality of the AlN film can be greatly improved, and thus the device performance can be effectively improved;
5) according to the fabricating method of the film bulk acoustic resonator provided in the embodiments of the present application, thin-layer graphene, metal Mo, metal W and other materials are fabricated on the SOI substrate, and then the AlN film is grown, which can also improve the crystal quality of the AlN film;
6) the film bulk acoustic resonator provided by the embodiments of the present application can meet the technical requirements brought by the development of the future 5G technology or devices having higher performance requirements.

DETAILED DESCRIPTION OF THE EMBODIMENTS

Figure 1:
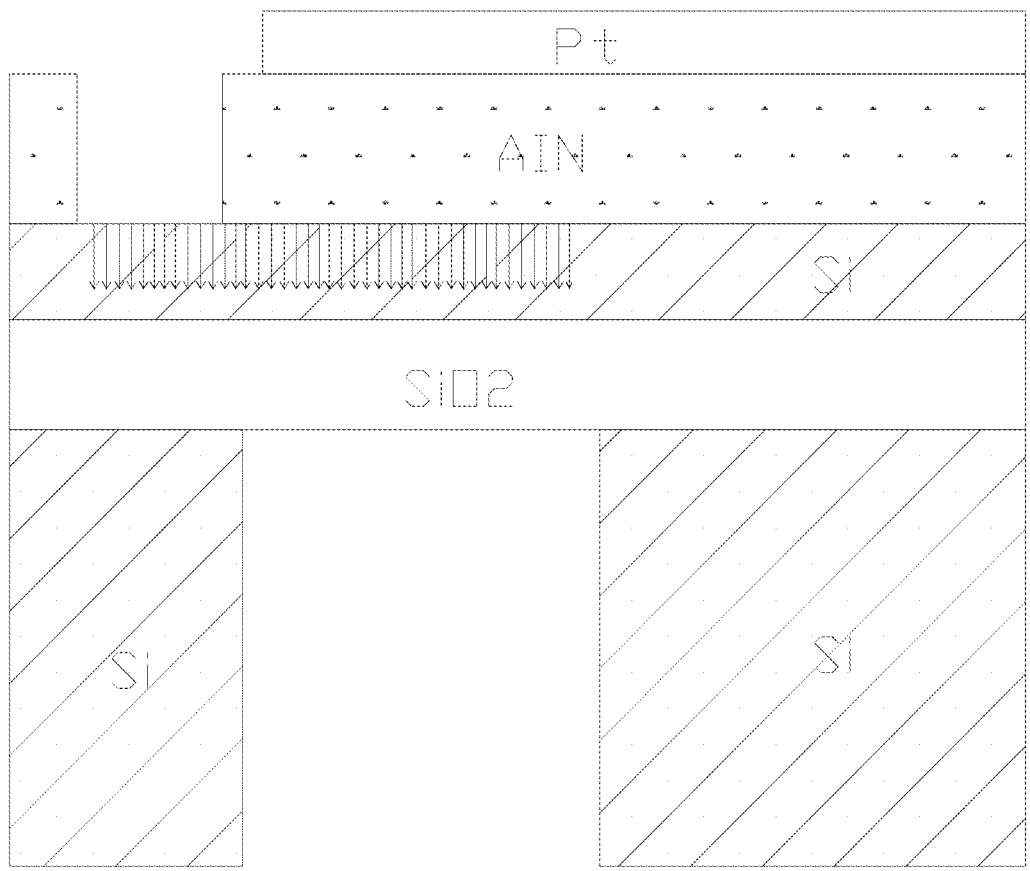
FIG. 1 is a structural diagram of a film bulk acoustic resonator in the prior art.

In view of the defects in the prior art, the inventor puts forward the technical solution of the present application through long-term researches and lots of practices. Next, the technical solution, an implementation process, a principle and the like will be further explained and illustrated.

Embodiments of the present application provides a fabricating method of a film bulk acoustic resonator, comprising:
fabricating a lower electrode on a first surface of an SOI substrate;
forming piezoelectric layers on the first surface of the SOI substrate and the lower electrode;
forming top electrodes on the piezoelectric layers; and
processing an air cavity on a second surface of the SOI substrate, wherein the second surface and the first surface are oppositely arranged.

In some specific embodiments, the fabricating method comprises: treating top silicon on the SOI substrate by using ion implantation so that the top silicon in a selected region is at least formed into a highly doped conductive silicon layer, and then patterning the highly doped conductive silicon layer to form the lower electrode.

In some specific embodiments, the fabricating method comprises: directly fabricating a conductive film layer in the selected region of the first surface of the SOI substrate, and then patterning the conductive film layer to form the lower electrode.

Preferably, the material of the conductive film layer comprises any one of graphene, molybdenum and tungsten, but is not limited thereto.

In some specific embodiments, the fabricating method comprises: forming the piezoelectric layer by using vapor phase epitaxy growth or magnetron sputtering growth.

Preferably, the material of the piezoelectric layer comprises AlN.

Preferably, the piezoelectric layer is a AlN piezoelectric film with C-axis orientation.

In some specific embodiments, the fabricating method comprises: patterning the piezoelectric layer after the piezoelectric films on the first surface of the SOI substrate and the lower electrode are fabricated.

Further, a through hole communicated with the outside is formed in the partial region of the piezoelectric layer corresponding to the lower electrode.

Preferably, the through hole is processed on the piezoelectric layer by using an inductive coupling plasma etching technology.

Preferably, the top electrode comprises a Pt electrode.

Further, the orientation of the SOI substrate is (111) or (100).

Further, the air cavity is formed in the back substrate of the SOI substrate.

Preferably, the depth of the air cavity is 50-1000 μm, and the area of the air cavity is 10 μm×10 μm-1 mm×1 mm.

Embodiments of the present application also provide a film bulk acoustic resonator fabricated by using the fabricating method of the film bulk acoustic resonator.

The air cavity type film bulk acoustic resonator provided by the present application includes the SOI (silicon-on-insulator) substrate, the piezoelectric layer and the top electrode. The resonator uses silicon (namely top silicon on the insulating layer in the SOI, the highly doped conductive silicon layer is formed through ion implantation as the lower electrode of the resonator; or a conductive layer is fabricated on the silicon on the insulating layer as the lower electrode. Meanwhile, the AlN piezoelectric film layer in C-axis orientation is grown on the lower electrode through deposition or sputtering, and the upper electrode layer is arranged on the piezoelectric layer. The structure innovation of the new FBAR (film bulk acoustic resonator) is used, so as to simplify the fabricating process of FBAR, the quality of the AlN film crystal grown through this method is high, the improvement of the device performance is facilitated, and meanwhile the frequency of the resonator is regulated by controlling the thickness of the top silicon through the position of silicon implanted oxygen isolation. The present application integrates the characteristics of low power consumption, high integration density, low cost, good radiation resistance and the like of the SOI material, which reduces the process complexity of device preparation and brings a new direction for fabrication of a future 5G communication system radio-frequency front end such as a filter, a duplexer and a multiplexer.

Next, the technical solution, the implementation process, the principle and the like will be further explained and illustrated.

Example 1

Figure 7:
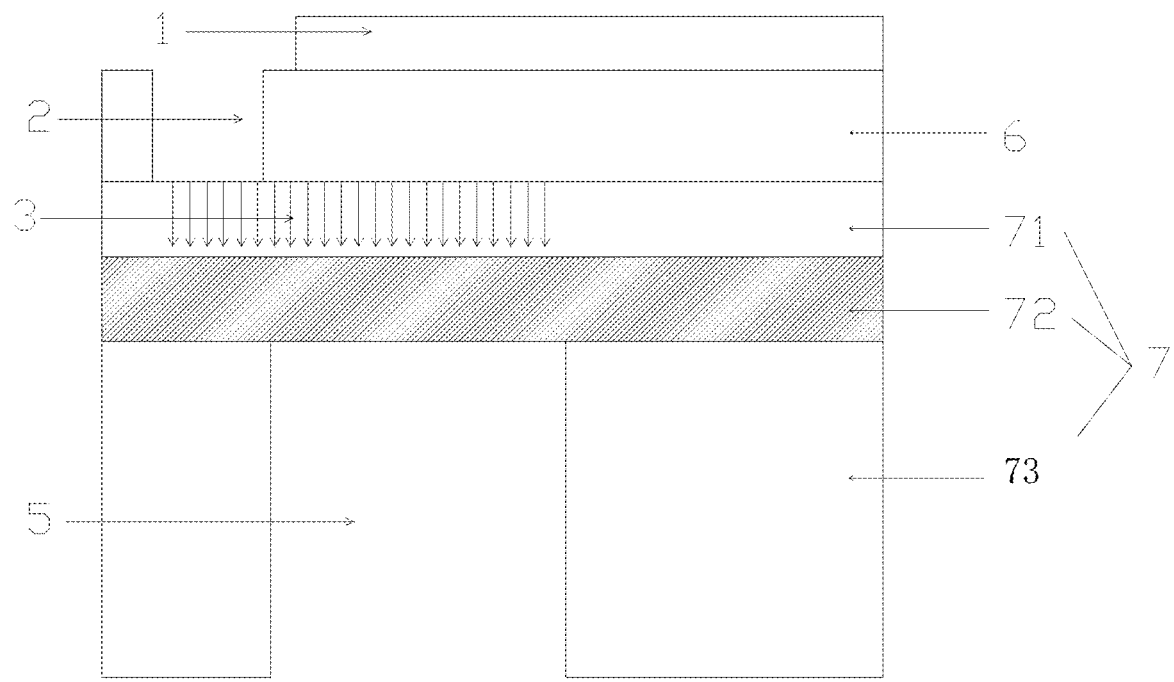
FIG. 7 is a cross-sectional view of a film bulk acoustic resonator fabricated in example 1 of the present application.
Figure 8:
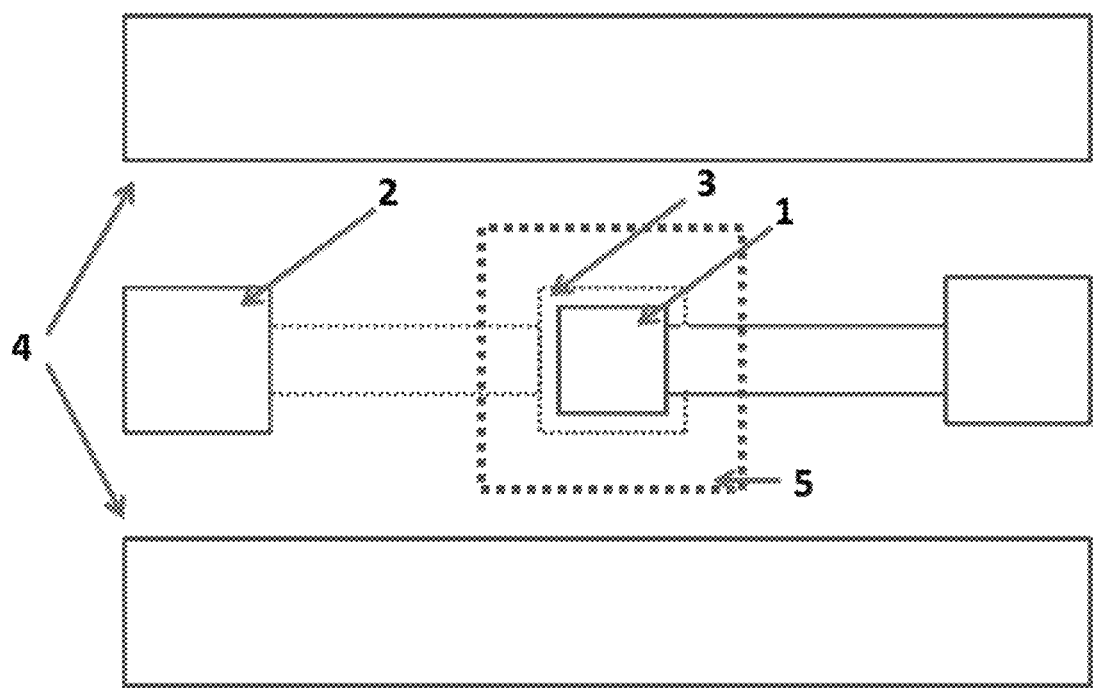
FIG. 8 is a top view of a film bulk acoustic resonator fabricated in example 1 of the present application.

Referring to FIG. 7 and FIG. 8, a film bulk acoustic resonator includes a SOI substrate 7 as well as a lower electrode 3, a piezoelectric layer 6 and a top electrode 1 which are arranged on the first surface (front side) of the SOI substrate 7 in turn. An air cavity 5 is formed on the second surface (back side) of the SOI substrate 7, the depth of the air cavity is about 200 µm and the area of the air cavity is about 150 µm×150 µm; wherein, the lower electrode 3 is a highly doped conductive silicon layer formed from the top silicon 71 of the SOI substrate 7 in the selected region via ion implantation, and through holes 2 connected with the outside are also formed in the corresponding regions of the piezoelectric layer 6 and the lower electrode 3; the air cavity 5 is formed in the back substrate 73 of the SOI substrate 7; wherein, the SOI substrate 7 includes the top silicon 71, the back substrate 73 and an oxidation layer arranged between the top silicon 71 and the back substrate 73, and the top electrode 1 adopts the Pt electrode. In practical application, two test G electrodes 4 are arranged at both sides of the film bulk acoustic resonator.

Figure 2:
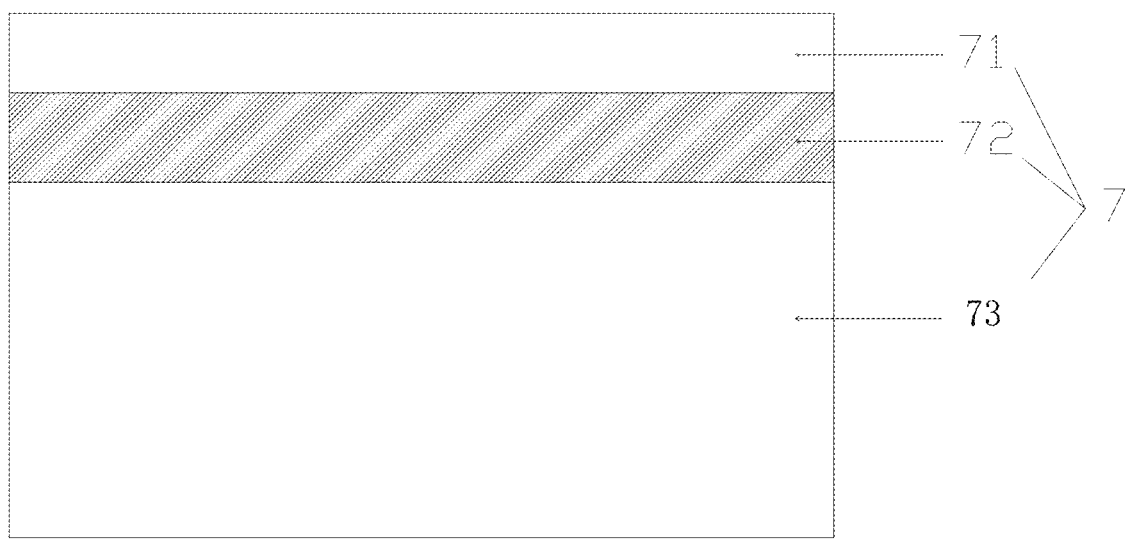
FIG. 2 is a cross-sectional view of an SOI substrate in a fabricating method of a film bulk acoustic resonator in example 1 of the present application.
Figure 3:
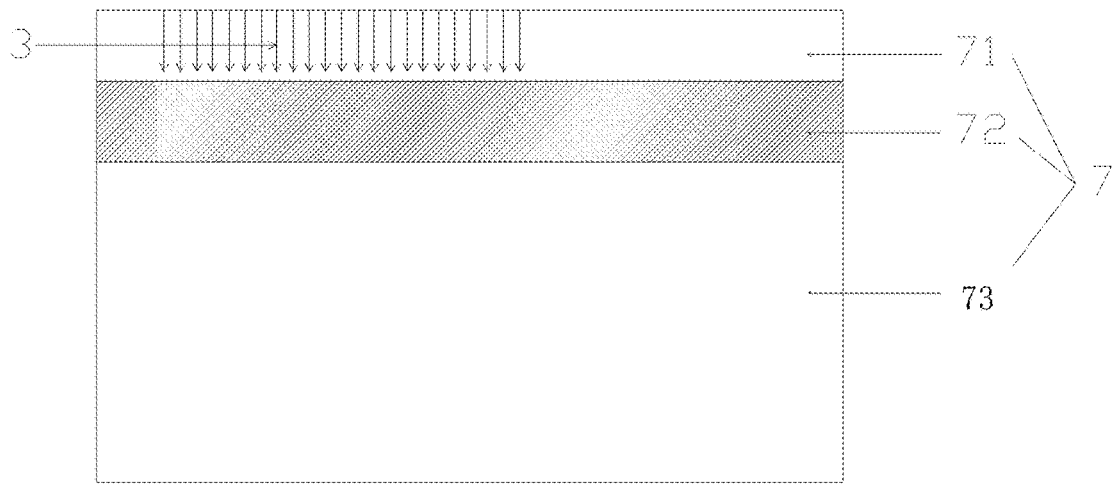
FIG. 3 is a cross-sectional view of a device subjected to selective ion implantation in a fabricating method of a film bulk acoustic resonator in example 1 of the present application.
Figure 4:
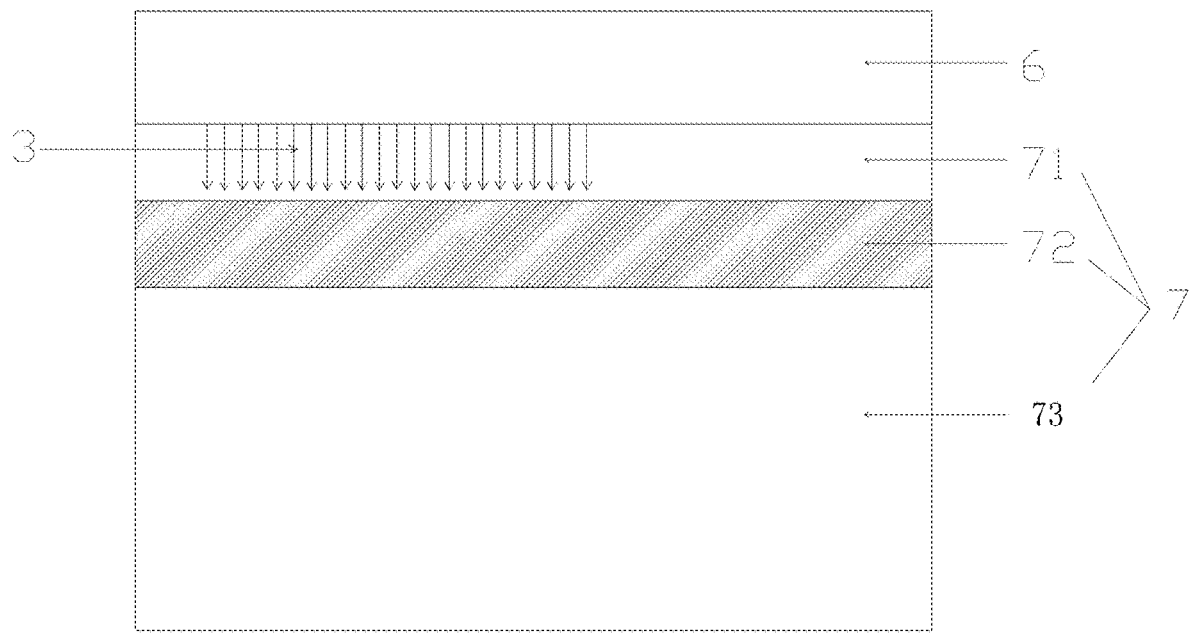
FIG. 4 is a cross-sectional view of a device after a piezoelectric layer is formed on an SOI substrate in a fabricating method of a film bulk acoustic resonator in example 1 of the present application.
Figure 5:
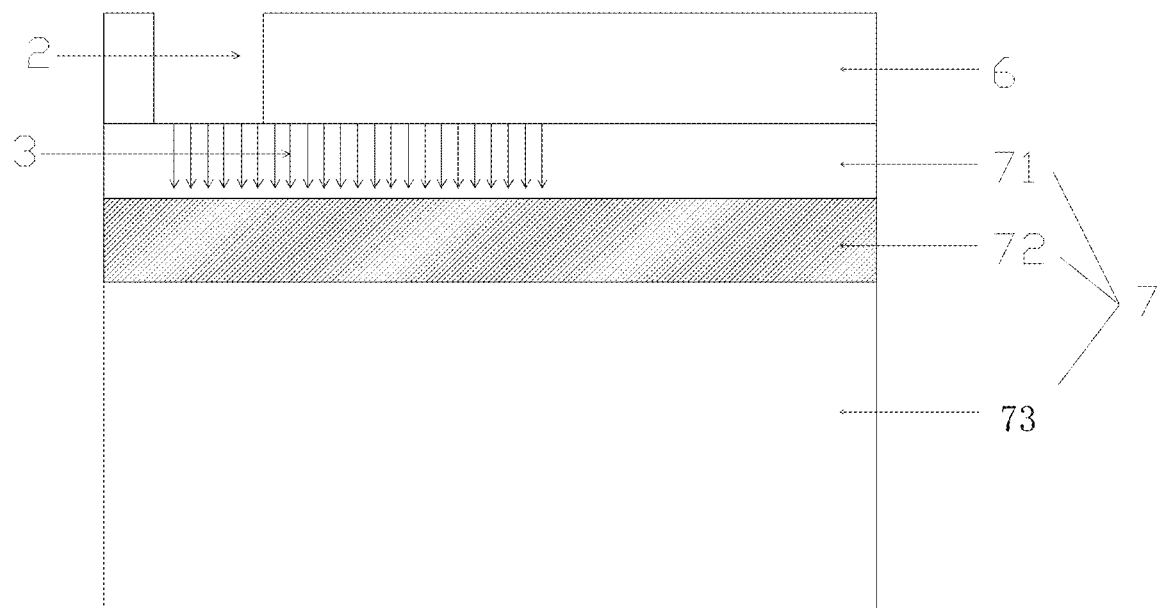
FIG. 5 is a cross-sectional view of a device after a through hole is formed on a piezoelectric layer in a fabricating method of a film bulk acoustic resonator in example 1 of the present application.
Figure 6:
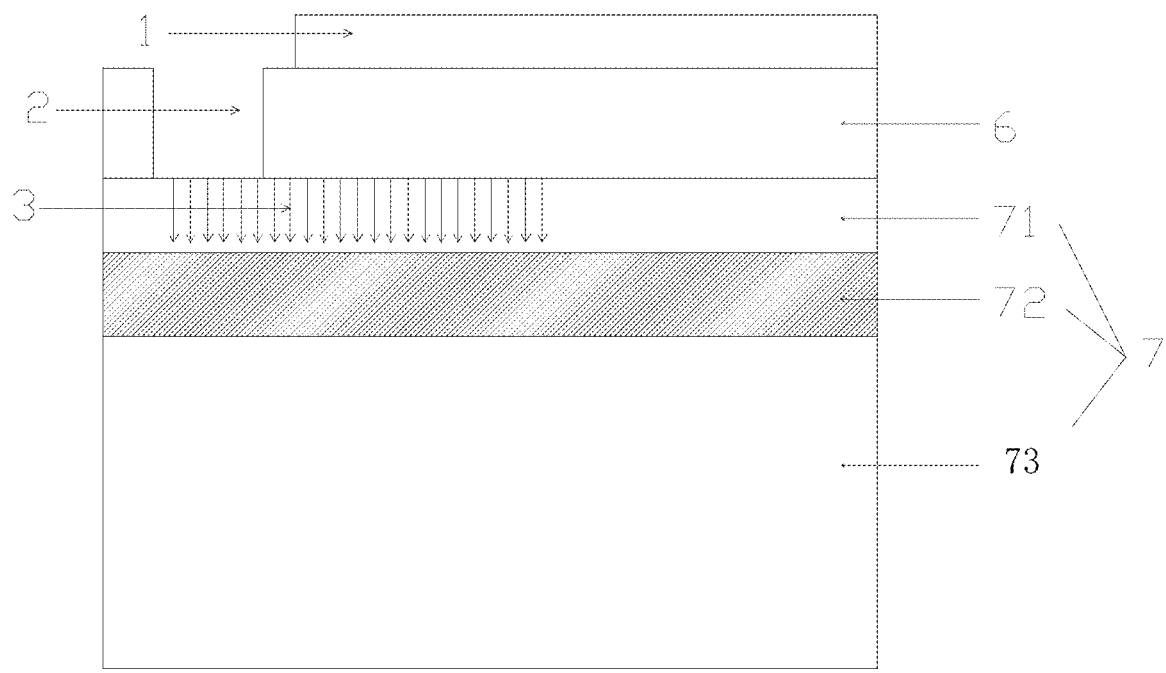
FIG. 6 is a cross-sectional view of a device after a top electrode is formed on a piezoelectric layer in a fabricating method of a film bulk acoustic resonator in example 1 of the present application.

Specifically, a fabricating method of a film bulk acoustic resonator can include the following steps:

1) the SOI substrate is provided and ultrasonically washed with acetone and isopropanol. The substrate structure is shown in FIG. 2, and the thickness of the substrate is 50 nm-1 µm;
2) photoetching patterning: on the top silicon of the SOI substrate, a part of the top silicon is formed into the highly doped conductive silicon via ion implantation, and the patterned highly doped conductive silicon is used as the lower electrode; the structure of the formed device is shown in FIG. 3;
3) the AlN piezoelectric film with high C-axis orientation is formed on the top silicon and the lower electrode of the SOI substrate by using vapor phase epitaxy (MOVCD) or magnetron sputtering. The structure of the formed device is shown in FIG. 4;
4) the through hole is etched on the piezoelectric layer via ICP; the structure of the formed device is shown in FIG. 5;
5) the top electrode is fabricated on the piezoelectric layer by using electron beam evaporation and patterned; the top electrode is the Pt electrode, and the structure of the formed device is shown in FIG. 6;
6) the substrate is back etched to form the air cavity, and the structure of the formed film bulk acoustic resonator is shown in FIG. 7.

The fabricating method provided by embodiments of the present application adopts a Si material on the insulating layer in the SOI to epitaxially deposit the AlN film. Such the AlN film crystal fabricated on Si (111) has good crystal quality, which is greatly improved compared with that of the AlN film formed by sputtering and other methods. The FWHM of the AlN film formed by sputtering is about 3° and the AlN epitaxially formed based on the fabricating method provided by the present application is generally less than 0.5°.

It should be understood that the above-mentioned example only illustrates the technical conception and characteristics of the present application, and its purpose is to enable those skilled in the art to understand the content of the present application and accordingly implement it, and can not limit the protective scope of the present application. Any equivalent changes or modifications made according to the spirit of the present application shall be covered within the protective scope of the present application.

What is claimed is:

1. A fabricating method of a film bulk acoustic resonator, comprising:
    fabricating a lower electrode on a first surface of an SOI substrate by treating a top silicon of the SOI substrate using an ion implantation method to at least make a selected region of the top silicon into a highly doped conductive silicon layer and patterning the highly doped conductive silicon layer to obtain the lower electrode, such that the patterned highly doped conductive silicon layer formed in the selected region of the top silicon is used as the lower electrode, wherein the SOI substrate comprises the top silicon, a back substrate, and an oxidation layer arranged between the top silicon and the back substrate;
    forming a piezoelectric layer on the first surface of the SOI substrate and the lower electrode;
    forming top electrodes on the piezoelectric layer; and
    processing an air cavity on a second surface of the SOI substrate, wherein the second surface and the first surface are oppositely arranged, and wherein the air cavity is below the oxidation layer and the air cavity is formed in the back substrate.

2. The fabricating method according to claim 1, comprising: fabricating a conductive film layer in a selected region of the first surface of the SOI substrate, and then patterning the conductive film layer to form the lower electrode.

3. The fabricating method according to claim 2, wherein a material of the conductive film layer selected from the group consisting of graphene, molybdenum and tungsten.

4. The fabricating method according to claim 1, comprising: forming each piezoelectric layer of the piezoelectric layers by using a vapor phase epitaxy growth or a magnetron sputtering growth.

5. The fabricating method according to claim 4, wherein a material of the each piezoelectric layer comprises AlN.

6. The fabricating method according to claim 5, wherein the each piezoelectric layer is an AlN piezoelectric film with a C-axis orientation.

7. The fabricating method according to claim 4, comprising: patterning the each piezoelectric layer after piezoelectric films are fabricated on the first surface of the SOI substrate and the lower electrode.

8. The fabricating method according to claim 1, wherein a through hole communicated with an outside is formed in a partial region of a piezoelectric layer of the piezoelectric layers corresponding to the lower electrode.

9. The fabricating method according to claim 8, comprising: processing the through hole on the piezoelectric layer by using an inductive coupling plasma etching technology.

10. The fabricating method according to claim 1, comprising: patterning a top electrode of the top electrodes after a top electrode layer is fabricated by using an electron beam evaporation; wherein, the top electrode comprises a Pt electrode.

11. The fabricating method according to claim 1, wherein an orientation of the SOI substrate is (111) or (100).

12. The fabricating method according to claim 1, wherein the air cavity is formed in a back substrate of the SOI substrate.

13. The fabricating method according to claim 12, wherein a depth of the air cavity is 50-1000 µm, and an area of the air cavity is 10 µm×10 µm-1 mm×1 mm.

14. A film bulk acoustic resonator fabricated by using the fabricating method of the film bulk acoustic resonator according to claim 1.

15. The film bulk acoustic resonator according to claim 14, wherein the fabricating method comprises: treating a top silicon on the SOI substrate using an ion implantation method to at least make the top silicon in a selected region into a highly doped conductive silicon layer, and then patterning the highly doped conductive silicon layer to form the lower electrode.

16. The film bulk acoustic resonator according to claim 14, wherein the fabricating method comprises: fabricating a conductive film layer in a selected region of the first surface of the SOI substrate, and then patterning the conductive film layer to form the lower electrode.

17. The film bulk acoustic resonator according to claim 16, wherein a material of the conductive film layer comprises one selected from the group consisting of graphene, molybdenum and tungsten.

18. The film bulk acoustic resonator according to claim 14, wherein the fabricating method comprises: forming each piezoelectric layer of the piezoelectric layers by using a vapor phase epitaxy growth or a magnetron sputtering growth.

19. The film bulk acoustic resonator according to claim 18, wherein a material of the each piezoelectric layer comprises AlN.

20. The fabrication method according to claim 1, wherein the selected region of the top silicon is smaller than a total region of the top silicon, such that the piezoelectric layer is in physical contact with each of the first surface of the SOI substrate and the lower electrode.

\* \* \* \* \*